United States Patent
Huang

(10) Patent No.: US 6,383,878 B1
(45) Date of Patent: May 7, 2002

(54) METHOD OF INTEGRATING A SALICIDE PROCESS AND A SELF-ALIGNED CONTACT PROCESS

(75) Inventor: Shui-Chin Huang, Tainan (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/850,305

(22) Filed: May 7, 2001

(30) Foreign Application Priority Data

Feb. 15, 2001 (TW) ........................................ 90103386 A

(51) Int. Cl.⁷ .......................................... H01L 21/336
(52) U.S. Cl. ..................... 438/299; 438/258; 438/592; 438/682; 438/649
(58) Field of Search ................................ 438/630, 649, 438/655, 664, 257, 258, 682, 592, 299

(56) References Cited

U.S. PATENT DOCUMENTS

| | | | | |
|---|---|---|---|---|
| 6,037,222 A | * | 3/2000 | Huang et al. | 438/257 |
| 6,221,767 B1 | * | 4/2001 | Hsu et al. | 438/658 |
| 6,297,084 B1 | * | 10/2001 | Joung et al. | 438/238 |
| 6,297,136 B1 | * | 10/2001 | Son | 438/592 |

* cited by examiner

Primary Examiner—Tuan H. Nguyen
(74) Attorney, Agent, or Firm—Ladas & Parry

(57) ABSTRACT

A method of integrating salicide process and self-aligned contact process is performed on a semiconductor substrate on which a plurality of doped gate electrodes and source/drain regions are formed in both a memory device area and a peripheral area. An oxide layer is formed on the exposed surface, and then a plurality of spacers is formed on the sidewalls of the gate electrodes respectively. Sequentially, a barrier layer and a buffering layer are formed on the exposed surface. Next, the buffering layer and the barrier layer are removed from the top of the gate electrodes to expose the oxide layer. The exposed oxide layer and the underlying gate electrodes are then removed until the gate electrode reaches a predetermined height. The salicide process is performed to form a silicide on the exposed surface of the gate electrodes and simultaneously on the source/drain regions in the periphery area. Next, a gate cap layer is formed on the silicide overlying the gate electrodes. After forming an inter-layer dielectric on the exposed surface, the self-aligned contact process is performed to form a contact hole to expose the source/drain region positioned between adjacent gate electrodes in the memory device area.

20 Claims, 14 Drawing Sheets

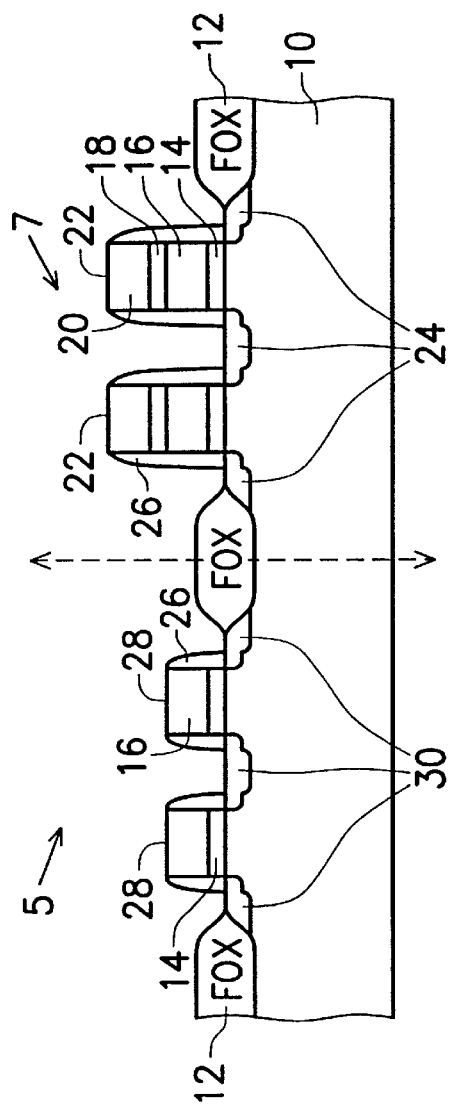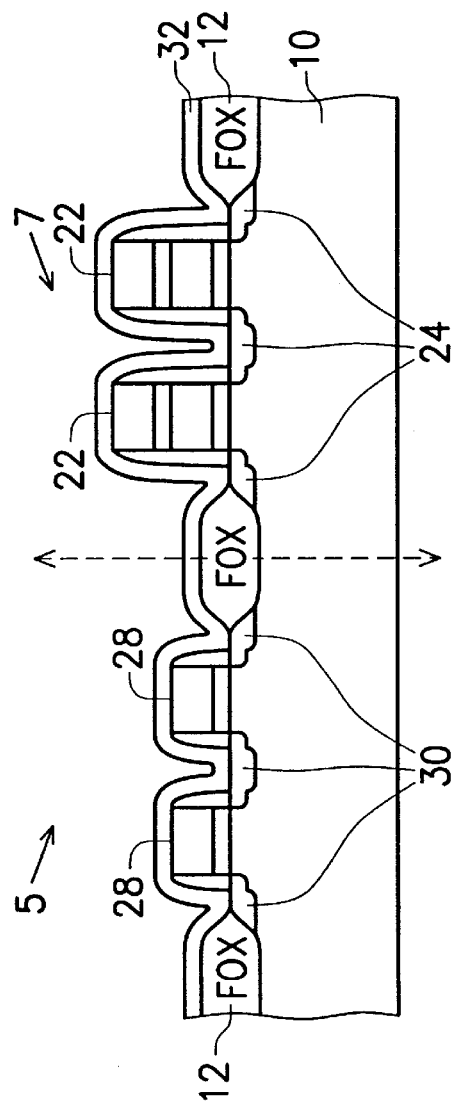
FIG. 2A (PRIOR ART)
FIG. 2B (PRIOR ART)

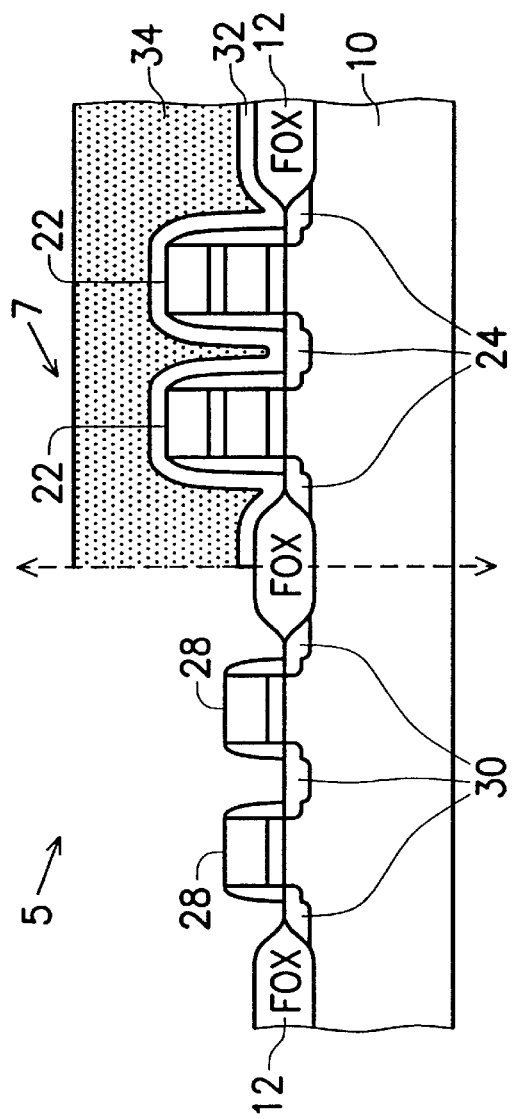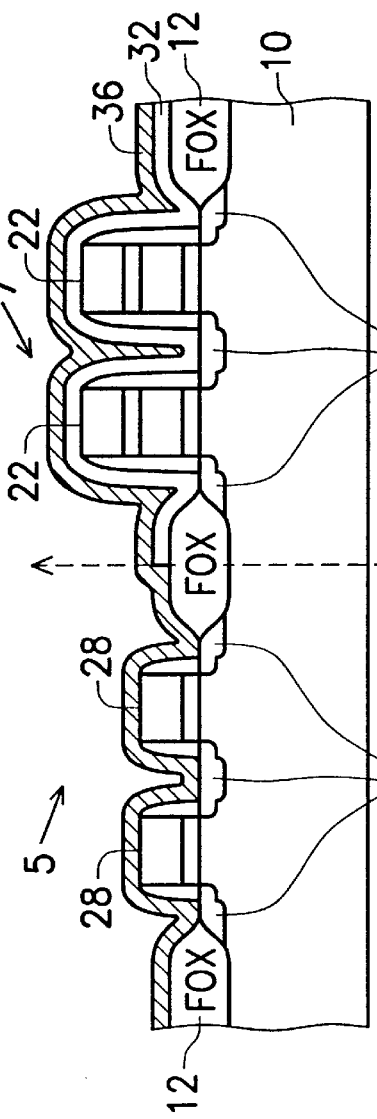
FIG. 2C (PRIOR ART)
FIG. 2D (PRIOR ART)

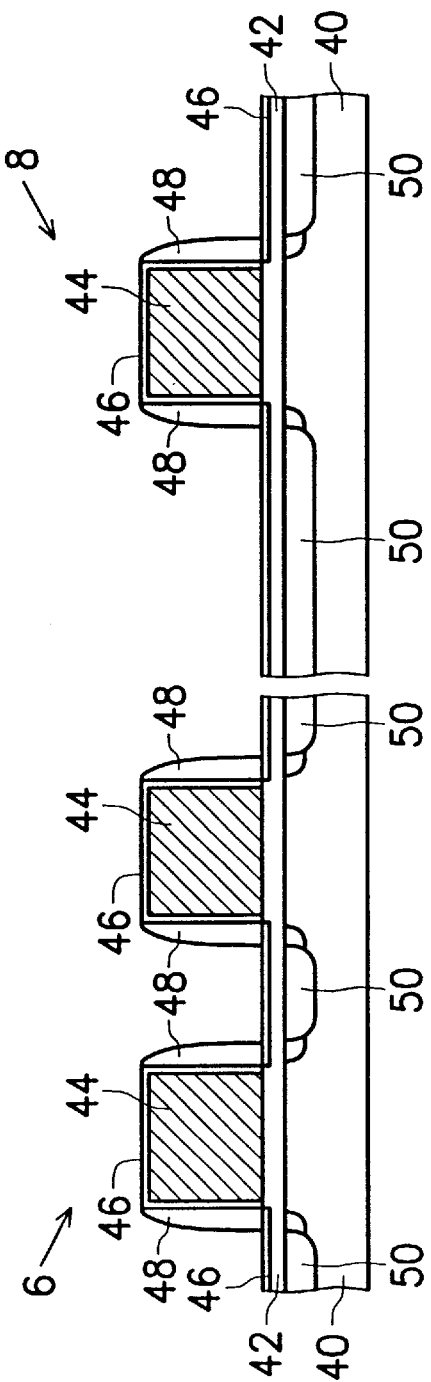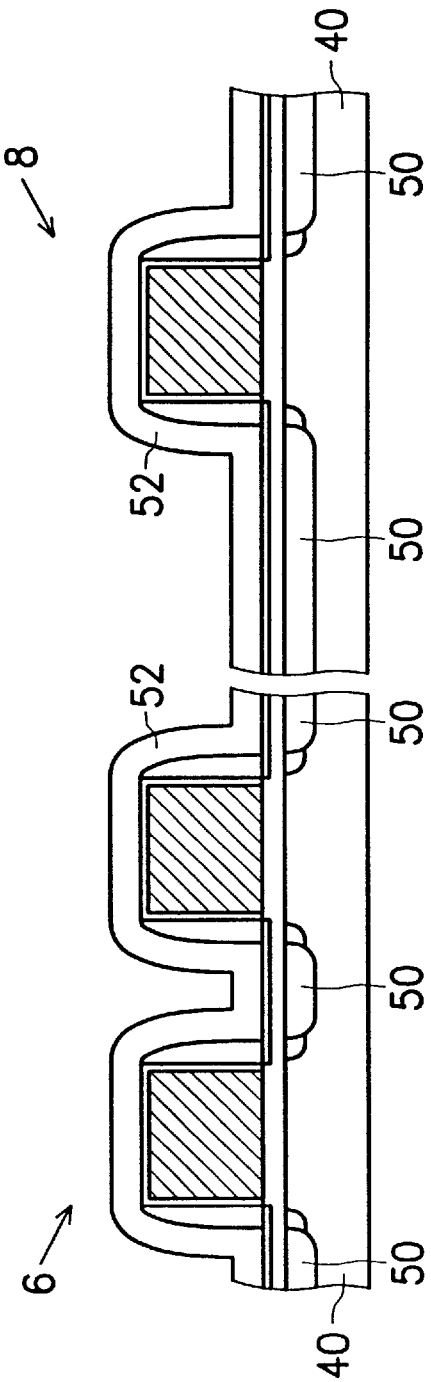

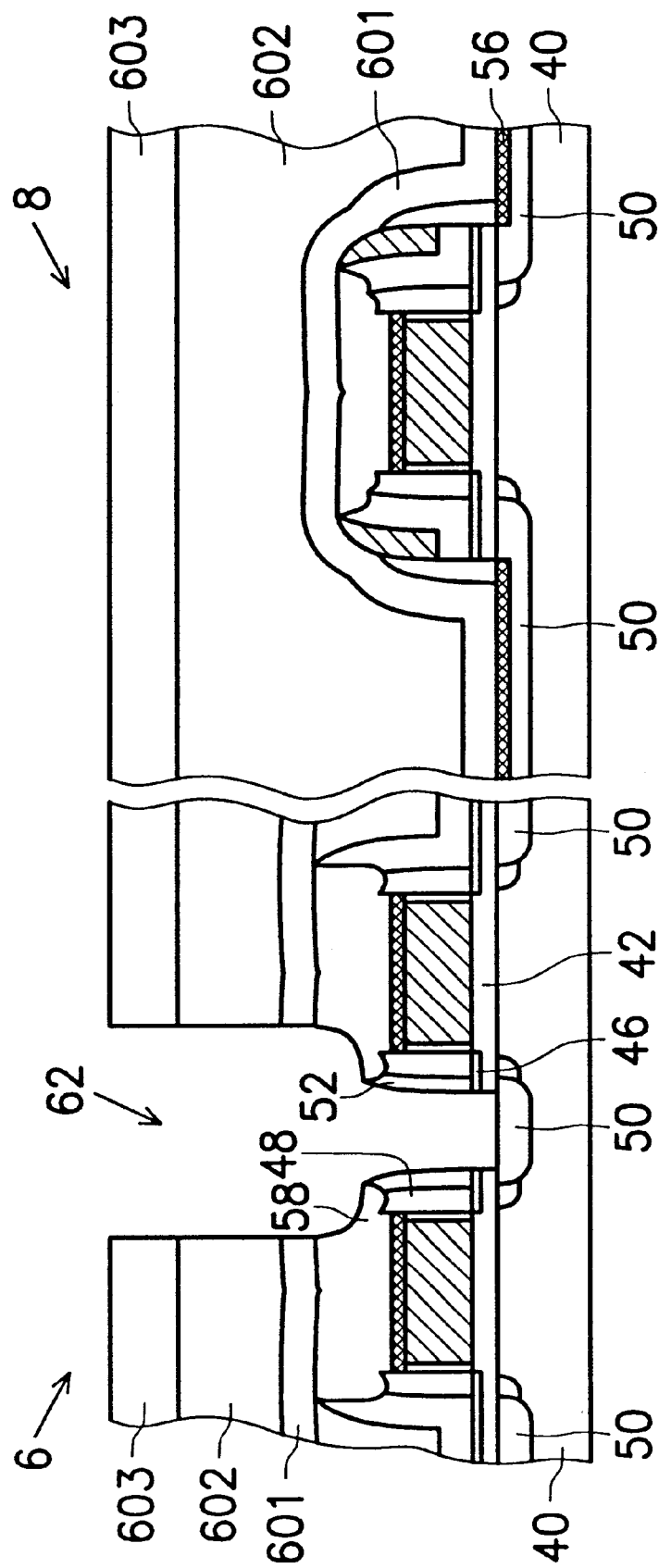

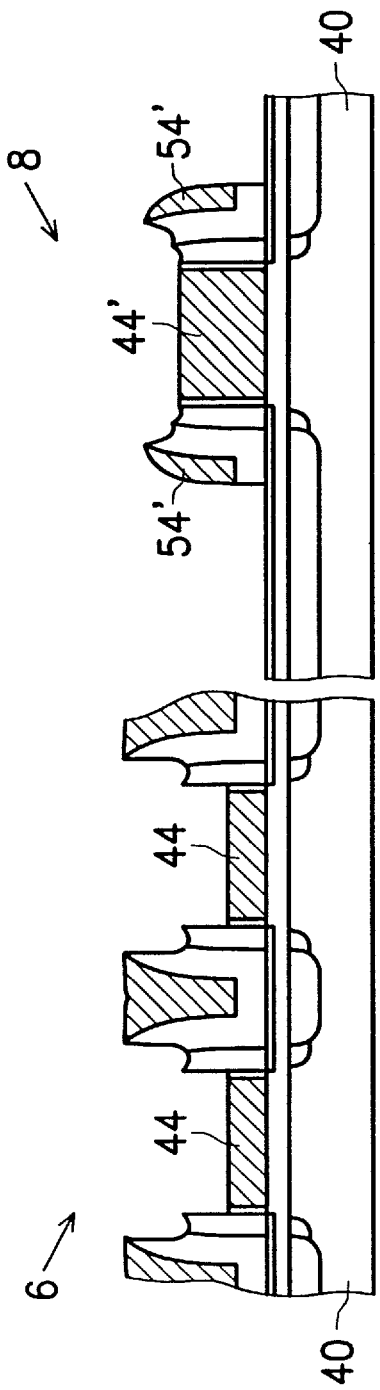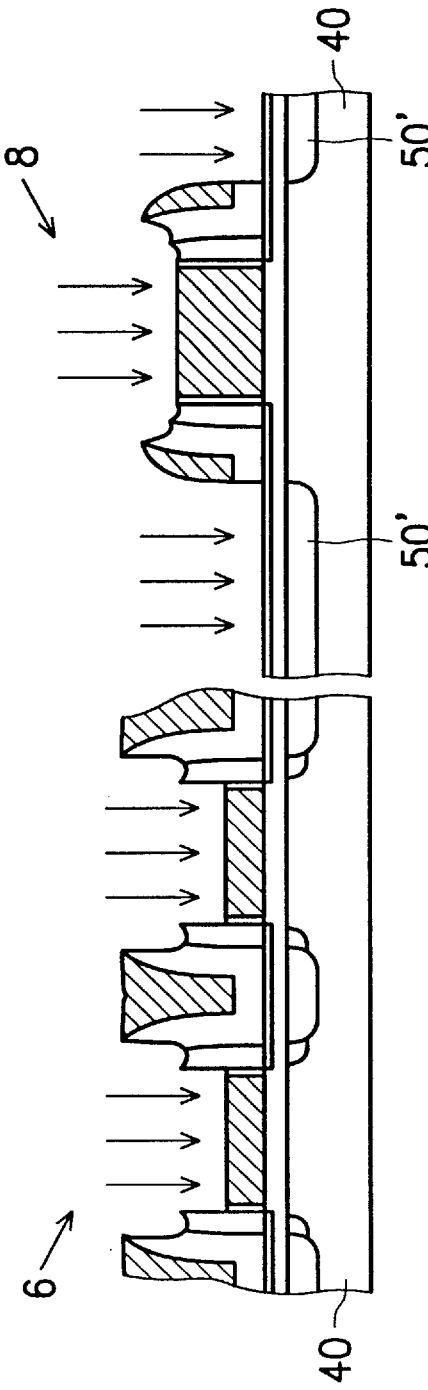
FIG. 4C
FIG. 4D

METHOD OF INTEGRATING A SALICIDE PROCESS AND A SELF-ALIGNED CONTACT PROCESS

BACKGROUND OF THE INVENTION

1. Field of the Invention

The present invention relates to the fabrication of integrated circuit devices and, more particularly, to a method of integrating a salicide process and a self-aligned contact process in the fabrication of integrated circuits.

2. Description of the Related Art

In the fabrication of integrated circuit devices, a self-aligned contact (SAC) process is often used to define the space between adjacent gate electrodes and limit it in order to reduce cell size, especially as applied to the fabrication of memory products, such as trench DRAM, stacked DRAM, and FLASH memory. Logic products are often produced using a salicide (self-aligned silicide) process, in which a refractory metal layer is deposited on a silicon layer and then annealed. The underlying silicon reacts with the refractory metal layer to produce a silicide overlying the gate electrode and source/drain regions. The silicided regions of gate electrode and source/drain regions have lower resistance than nonsilicided regions, and thereby improve circuit performance. Referring to FIG. 1, a gate structure is composed of a silicon nitride cap layer 1, a polycide layer 2, and a doped-polysilicon layer 3. Using SAC process, a contact hole 4 is formed between two adjacent gate structures. However, in the application of the logic process, there are issues, such as lower circuit performance and a problem with surface channel of the PMOS device, associated with the gate structure. Seeking to solve the shortcomings with conventional technique, the salicide process is only provided to periphery areas. Alternatively, the SAC process is avoided.

With respect to the fabrication of embedded memory, memory devices and logic circuits for addressing the memory devices are formed on the same chip. It is desired to find a method of integrating the salicide process and SAC process on a wafer so as to achieve both high logic performance and high-density memory for embedded memory. Referring to FIGS. 2A to 2F, a method of integrating the salicide process and SAC process is disclosed by U.S. Pat. No. 5,998,252. As shown in FIG. 2A, a semiconductor substrate 10 has a plurality of field oxide regions 12, and is divided by a dashed line into a logic circuit area 5 and a memory device area 7. In the memory device area 7, a plurality of gate structures 22 and source/drain regions 24 are fabricated on the semiconductor substrate 10. Each of the gate structures 22 is composed of a gate insulating layer 14, a polysilicon layer 16, a silicon oxide layer 18, and a silicon nitride cap layer 20. In the logic circuit area 5, a plurality of gate structures 28 and source/drain regions 30 are formed on the semiconductor substrate 30. Each of the gate structures 28 is composed of a gate insulating layer 14, a polysilicon layer 16, and a silicon nitride spacer 26 covered on the sidewall of the gate structure 28.

Referring to FIGS. 2C and 2B, a conformal protection layer 32 is applied over the exposed surface of the semiconductor substrate 10, and a photoresist layer 34 is patterned on the protection layer 32 in the memory device area 7. Next, using the photoresist layer 34 as a mask, the protection layer 32 in the logic circuit area 5 is removed, thus the gate structures 28 and the source/drain regions 30 in the logic circuit area 5 are exposed. Referring to FIGS. 2D and 2E, a refractory metal layer 36, preferably made of Ti or TiN, is deposited on the exposed surface of the semiconductor substrate 10, and then the refractory metal layer 36 reacts with underlying silicon through rapid thermal anneal (RTA) process. As a result, a silicide layer 38 is formed on the top of the gate structure 28 and the exposed surface of the source/drain region 30 in the logic circuit area 5.

Referring to FIG. 2F, the SAC process is performed in the memory device area 7. An inter-layer dielectric 37 is deposited on the semiconductor substrate 10, and then the inter-layer dielectric 37 and the protection layer 32 positioned between adjacent gate structures 22 are removed by a dry etching process. Therefore, a contact hole 39 is completed wherein the source/drain region 24 between adjacent gate structures 22 is exposed.

In the aforementioned method, the salicide process is only applied to the logic circuit area 5. That means the silicide 38 cannot be formed on the polysilicon layer 16 in the memory device area 7 at the same time when the silicide 38 is formed on the gate structure 28 and the source/drain region 30 in the logic circuit area 5. None of the above inventions and patents, taken either singularly or in combination, is seen to describe the instant invention as claimed. Thus, a method of integrating the salicide process and the SAC process solving the aforementioned problems is desired.

SUMMARY OF THE INVENTION

The present invention is a method of integrating the salicide process and the self-aligned contact (SAC) process to form a silicide on the gate electrode in a memory device area at the same time that the silicide is formed on the gate electrode and the source/drain regions in a periphery area. The method of integrating the salicide process and SAC process is provided on a semiconductor substrate that is divided into a memory device area or a periphery area for fabricating embedded memory and trench DRAM. An oxide layer is formed on the exposed surface, and then a plurality of spacers is formed on the sidewalls of the gate electrodes respectively. Sequentially, a barrier layer and a buffering layer are formed on the exposed surface. Next, the buffering layer and the barrier layer are removed from the top of the gate electrodes to expose the oxide layer. The exposed oxide layer and the underlying gate electrodes are then removed until the gate electrode reaches a predetermined height. The salicide process is performed to form a silicide on the exposed surface of the gate electrodes and simultaneously on the source/drain regions in the periphery area. Next, a gate cap layer is formed on the silicide overlying the gate electrodes. After forming an inter-layer dielectric on the exposed surface, the self-aligned contact process is performed to form a contact hole to exposes the source/drain region positioned between adjacent gate electrodes in the memory device area.

In the first modification, the gate electrodes are fabricated as stacked gate electrodes are fabricated through more masks and etching processes for the application of FLASH memory. Also, a combination structure of an oxide spacer and a nitride spacer is employed on the sidewall of the stacked gate structure for solving the leakage problem and preventing the source/drain region from pitting phenomenon.

In the second modification, since the oxide layer is possibly removed to expose active regions in an etching environment, a cap layer formed on the top of the gate electrodes is required prior to removing the gate electrodes.

In the third modification, a photoresist layer in the periphery area is required after performing the etch-back process on the buffering layer in order to avoid the pitting phenomenon of the source/drain regions from the insufficient etching effect on the oxide layer. Therefore, after etching the gate electrodes, the height of the gate electrode in the periphery area is higher than the height of the gate electrode in the memory device area.

In the fourth modification, an ion-implantation process that is performed on the gate electrodes and the source/drain regions is performed in the memory device area at the beginning, and then performed on the semiconductor substrate in the periphery area to form a source/drain region surrounding the gate electrode in the periphery area after etching the gate electrodes.

In the fifth modification, a cap layer is required prior to the formation of the gate cap layer in order to prevent the silicide from over-etching during the etch-back process on the gate cap layer.

Accordingly, it is a principal object of the invention to provide a method to integrate the salicide process and the SAC process to achieve both high logic performance and high-density memory.

It is another object of the invention to provide the application of FLASH memory.

Yet another object of the invention is to solve the leakage problem and protect the source/drain region from pitting.

It is a further object of the invention to avoid pitting of the source/drain regions from the insufficient etching effect of the oxide layer.

Still another object of the invention is to prevent the silicide from over-etching during the etch-back process on the gate cap layer.

These and other objects of the present invention will become readily apparent upon further review of the following specification and drawings.

BRIEF DESCRIPTION OF THE DRAWINGS

FIGS. 2A to 2F are cross-sectional diagrams of a method of integrating the salicide process and the SAC process according to the prior art.

FIGS. 3A to 3K are cross-sectional diagrams of a method of integrating the salicide process and the SAC process according to the present invention.

FIG. 4C is a cross-sectional diagram of the third modification of the present invention.

FIG. 4D is a cross-sectional diagram of the fourth modification of the present invention.

Similar reference characters denote corresponding features consistently throughout the attached drawings.

DETAILED DESCRIPTION OF THE PREFERRED EMBODIMENTS

Figure 1:
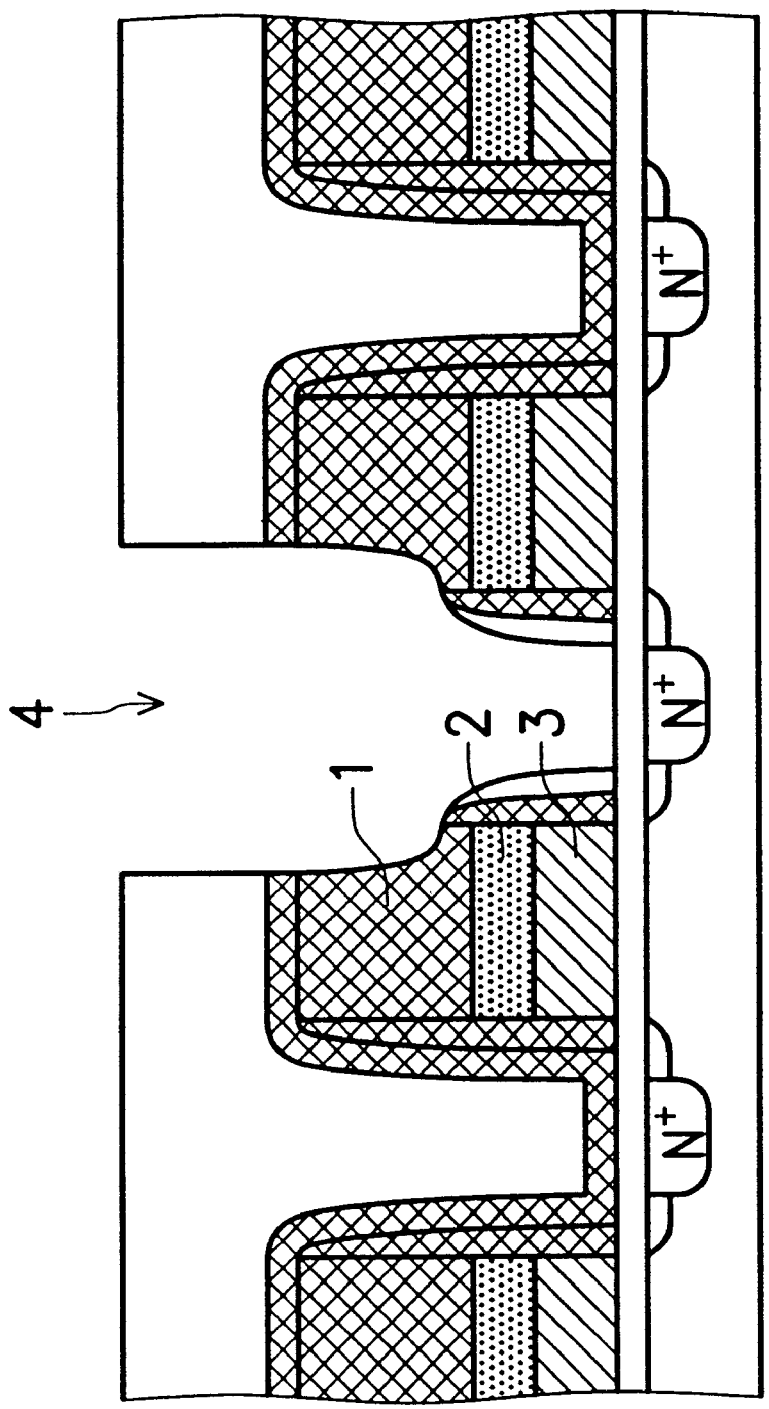
FIG. 1 is a cross-sectional diagram of a conventional gate structure.
Figure 2E:
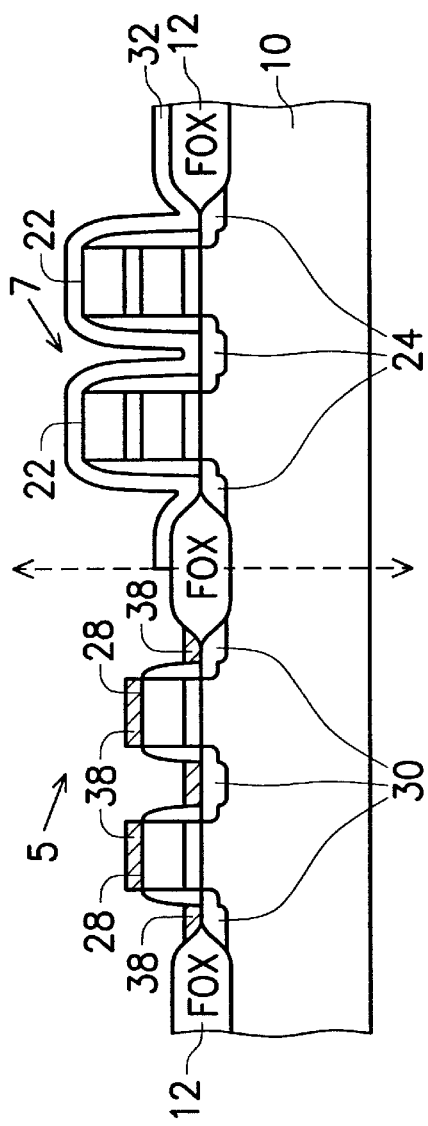
Figure 2F:
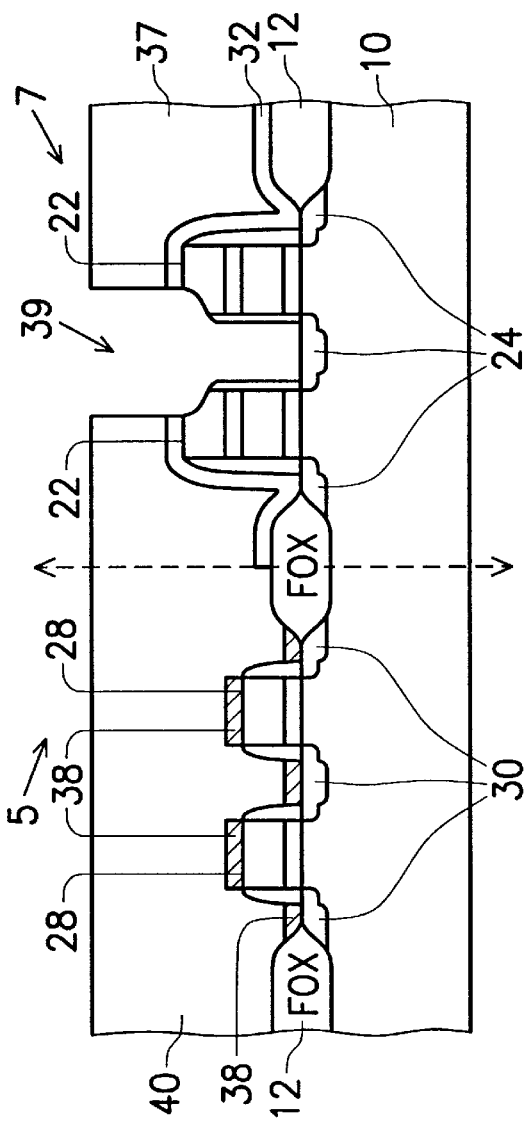
Figure 3C:
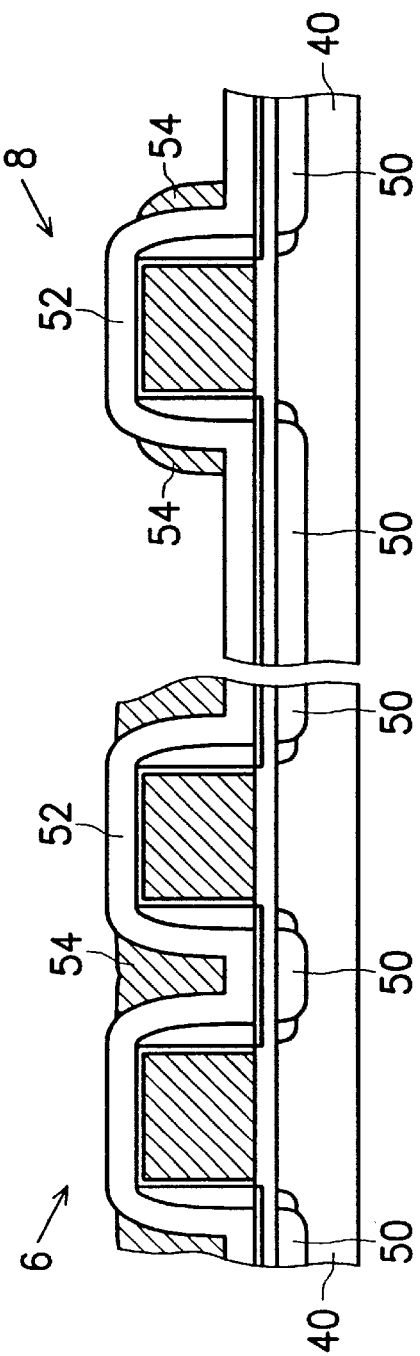

A method of integrating the salicide process and SAC process is provided for fabricating embedded memory. Referring to FIGS. 3A to 3K, a fabrication of trench DRAM is described in detail by cross-sectional diagrams. As shown in FIG. 3A, a semiconductor substrate 40 is divided into a memory device area 6 and a periphery area 8, in which a gate insulating layer 42 is formed on the semiconductor substrate 40, a plurality of gate electrodes 44 made of doped-poly material is patterned on the gate insulating layer 42, and an oxide layer 46 is conformally covered on the surfaces of the gate electrodes 44 and the gate insulating layer 42. A plurality of sidewall spacers 48 made of silicon nitride or silicon oxide is covered on the sidewalls of the gate electrodes respectively apart from the oxide layer 46. A plurality of source/drain regions 50 is formed surrounding the gate electrodes 44 respectively.

Figure 3D:
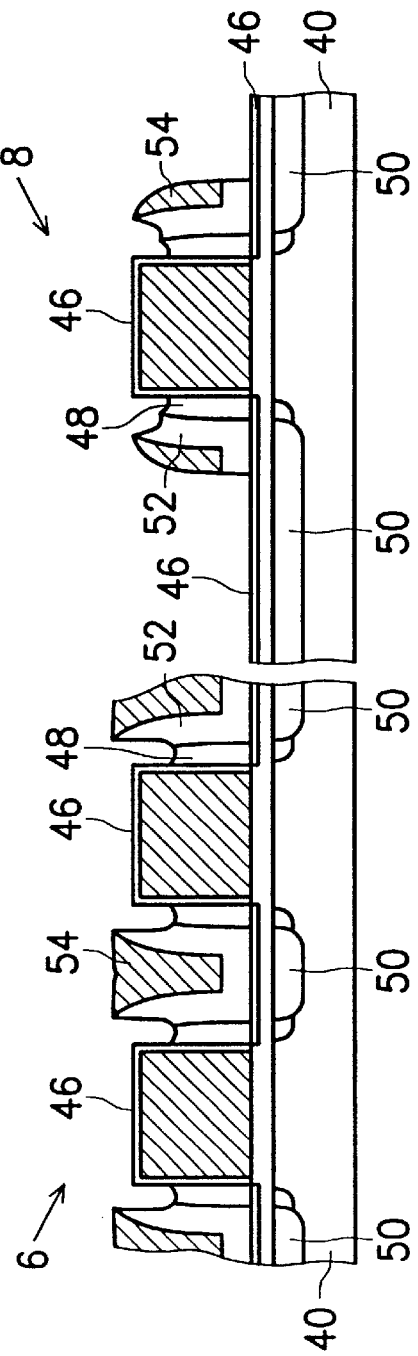

Referring to FIGS. 3B and 3C, a barrier layer 52 of silicon nitride is deposited on the exposed surface of the semiconductor substrate 40, and then a buffering layer 54 made of silicon oxide is formed on the barrier layer 52. Next, using the barrier layer 52 as a mask, an etch-back process is performed on the buffering layer 54 to expose part of the barrier layer 52 positioned on the top of the gate electrodes 44. Referring to FIG. 3D, using the remaining oxide layer 54 as an etch stop layer, the barrier layer 52 positioned on the top of the gate electrodes 44 is removed. Meanwhile, in the periphery area 8, the barrier layer 52 overlying the source/drain regions 50 is removed.

Figure 3E:
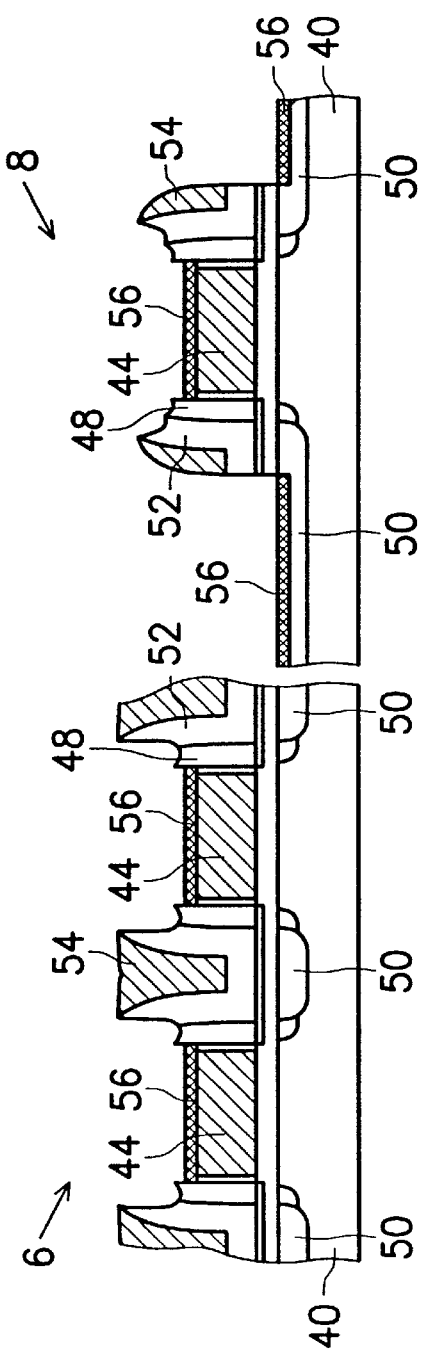
Figure 3F:
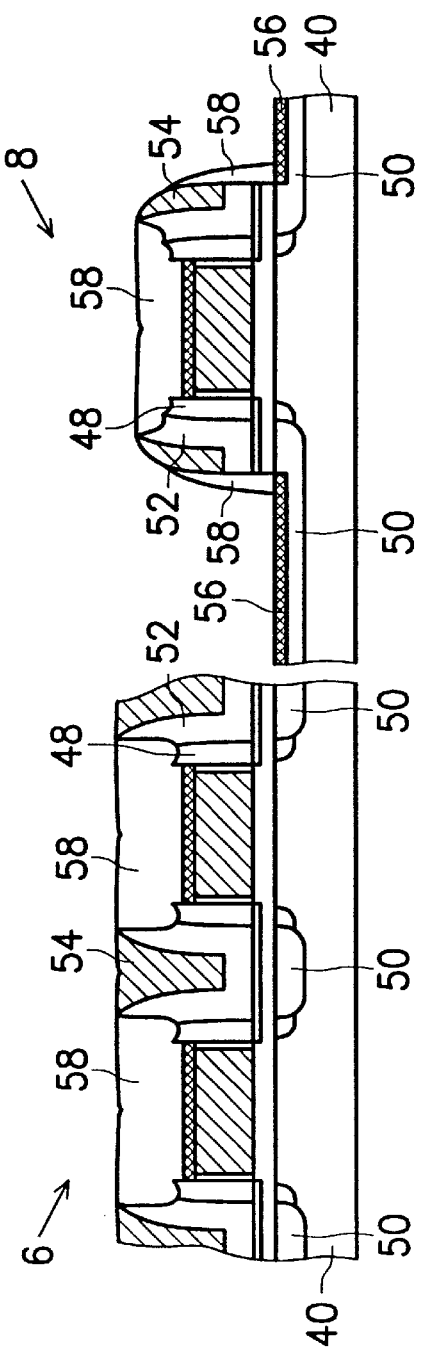

Referring to FIG. 3E, the exposed oxide layer 46 is removed, and then each of the gate electrodes 44 is removed until a predetermined height, at least lower than the height of the sidewall spacer 48, is reached. Next, the salicide process is performed to form a silicide 56 on the exposed surfaces of the gate electrodes 44 and the source/drain regions 50. With respect to the salicide process, a refractory metal layer (not shown), preferably made of Ti or W, is deposited on the exposed surface of the semiconductor substrate 40. By way of thermal treatment, the refractory metal layer reacts with the underlying silicon to form the silicide 56, such as $TiSi_x$ or $WSi_x$. The non-reacted part of the refractory metal layer is then removed. Thus, the combination of the gate electrode 44 and the overlying silicide 56 serves as a polycide layer. In addition, referring to FIG. 3F, in order to prevent the damage to the profile of the polycide layer from subsequent SAC process, a gate cap layer 58 made of silicon nitride for covering the exposed surface of the polycide layer is required through deposition and etch-back processes.

Figure 3G:
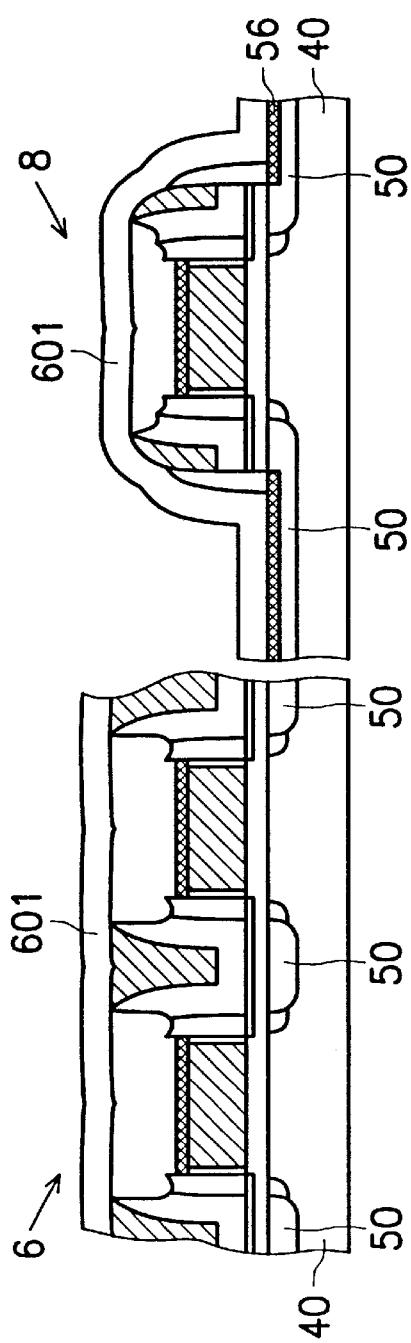
Figure 3H:
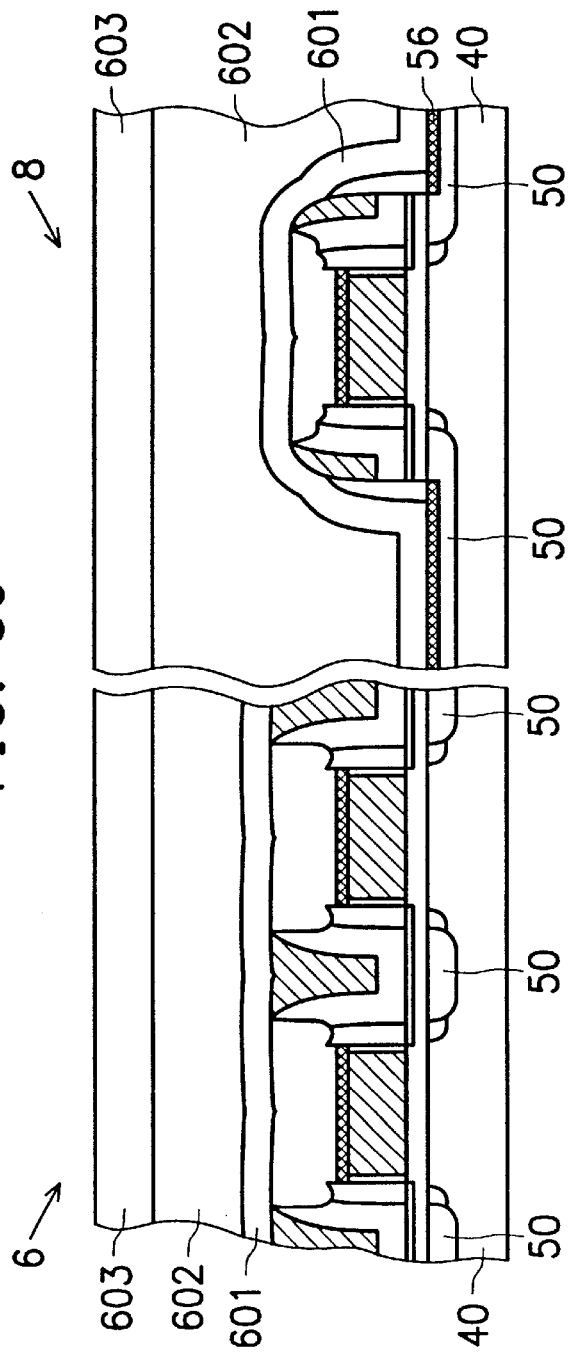
Figure 3I:
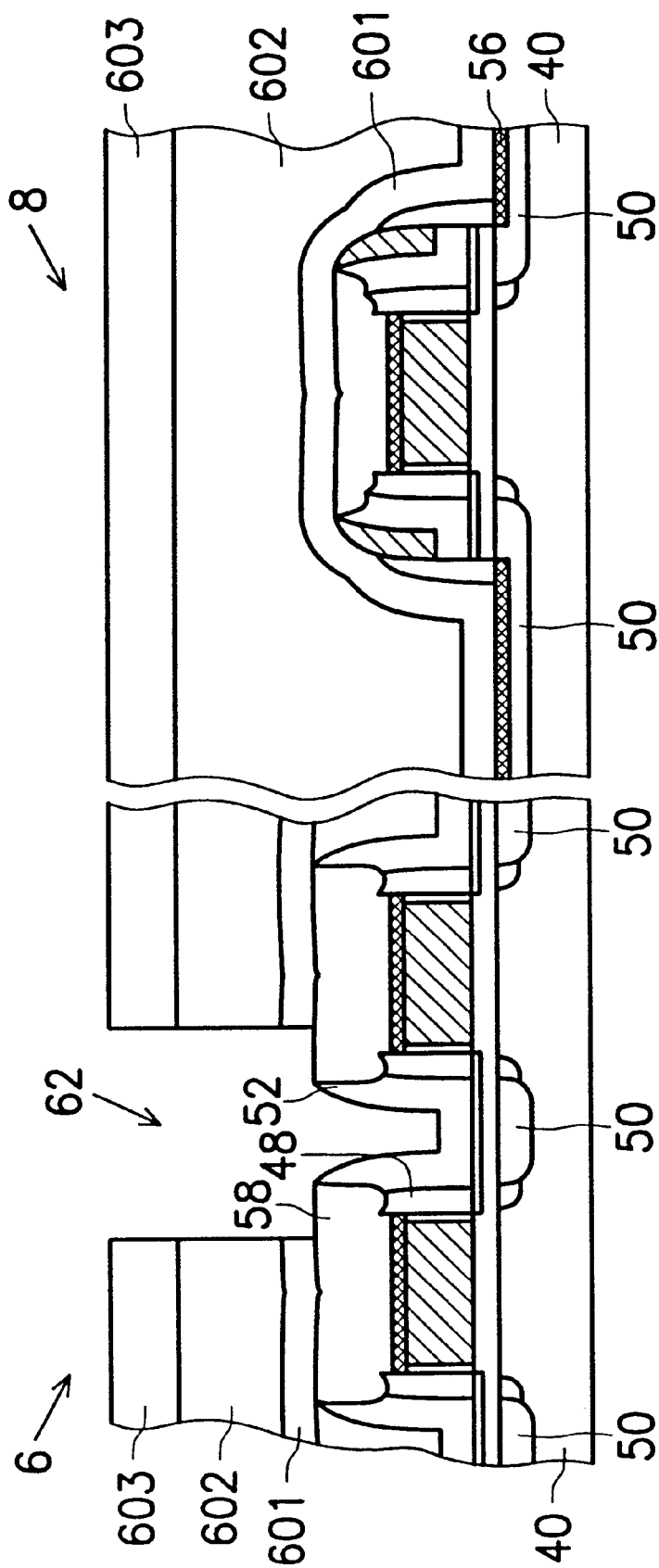
Figure 3K:
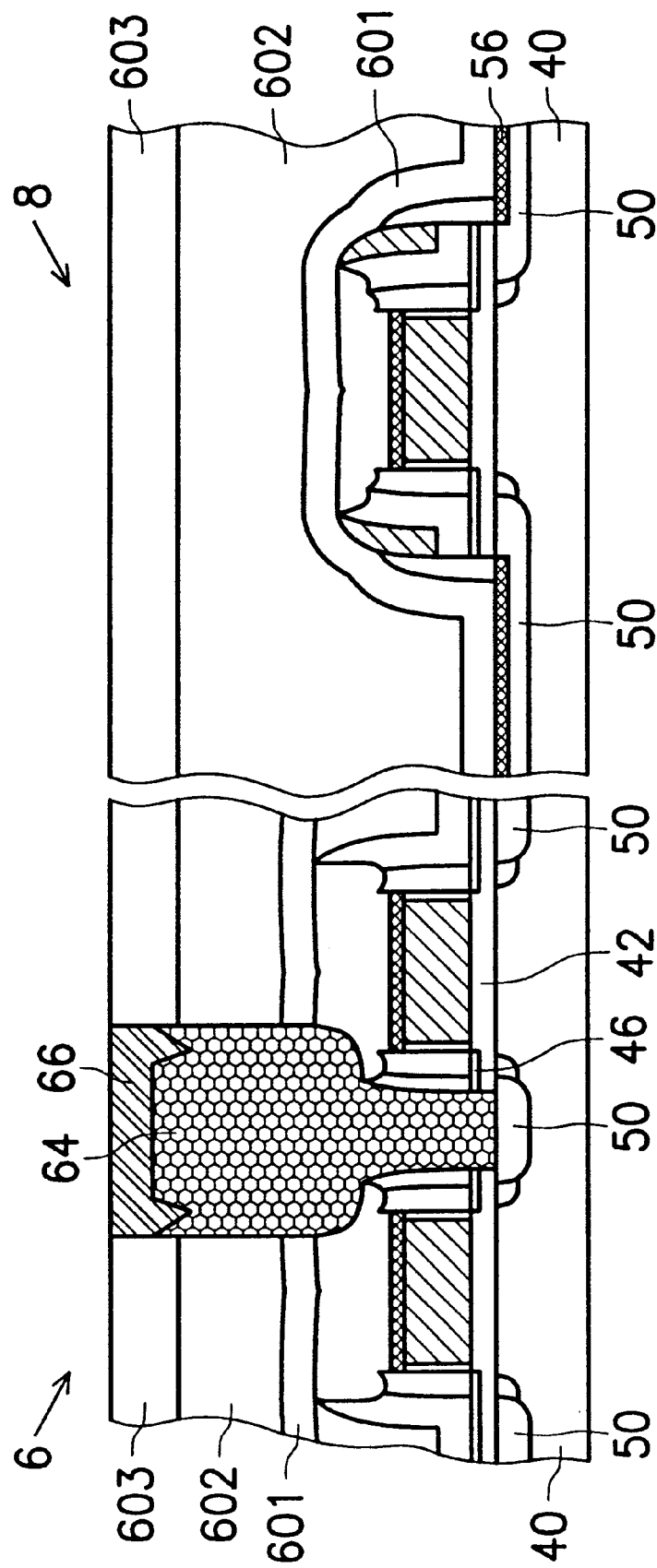

The SAC process is provided in the memory device area 6. Referring to FIGS. 3G and 3H, a first inter-layer dielectric 601, a second inter-layer dielectric 602, and a third inter-layer dielectric 603 are sequentially deposited on the exposed surface of the semiconductor substrate 40, and then a chemical-mechanical polishing (CMP) process is performed to flatten the surface of the third inter-layer dielectric 603. Referring to FIG. 3I, using a patterned photoresist layer (not shown) for defining a contact hole 62, the third inter-layer dielectric 603, the second inter-layer dielectric 602 and the first inter-layer dielectric 602 are removed by a dry etching process, and then the exposed buffering layer 54 between adjacent gate electrodes 44 is removed with the barrier layer 52 as an etching stop layer. Referring to FIG. 3J, the greater part of the barrier layer 52 is removed, and the exposed oxide layer 46 and the underlying gate insulating layer 42 are removed, exposing the source/drain region 50. This completes the fabrication of the contact hole 62 in the memory device area 6. Finally, as shown in FIG. 3K, the contact hole 62 is filled with a first conductive layer 64 to serve as a contact plug, and then a second conductive layer 66 is formed on the first conductive layer 64 to serve as a bit line.

In a method to integrate the salicide process and the SAC process, the silicide 56 is simultaneously formed on the gate electrodes 44 in the memory device area 6 and the periphery area 8 and on the source/drain regions 50 in the periphery area 8. This achieves both high logic performance and high-density memory.

Figure 4A:
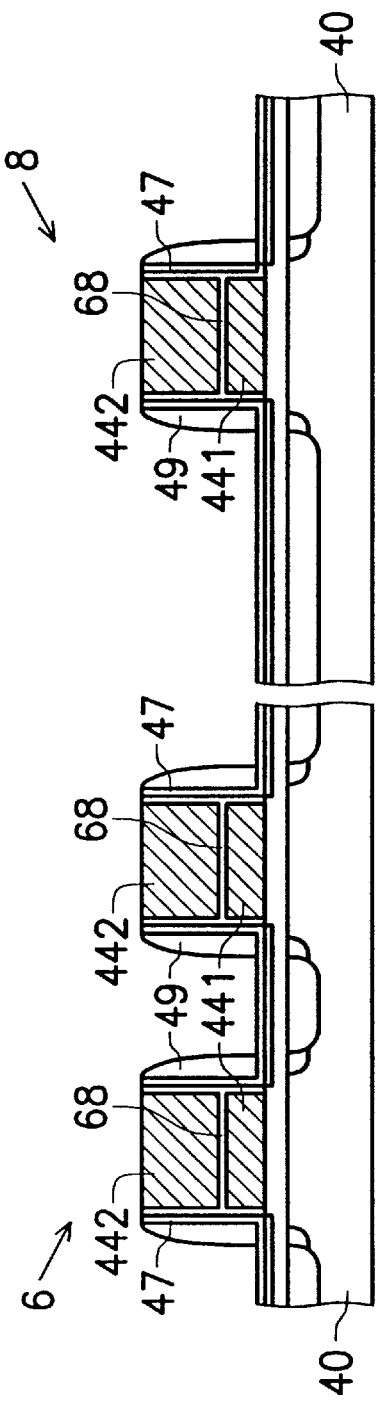
FIG. 4A is a cross-sectional diagram of the first modification of the present invention.

In addition, by modifying some steps of the aforementioned method in the preferred embodiment, better process performance is achieved. In the first modification, compared with the gate electrodes 44 shown in FIG. 3A, stacked gate electrodes are fabricated through more masks and etching processes in FIG. 4A, in which a first dielectric layer 68 is sandwiched between a first gate electrode 441 and a second gate electrode 442. In another preferred embodiment, the stacked gate structure is applied to FLASH memory wherein the first dielectric layer 68 is an ONO structure, and the first gate electrode 441 serves as a floating gate. Also, compared with the sidewall spacer 48 shown in FIG. 3A, a combination of a oxide spacer 47 and a nitride spacer 49 is covered on the sidewall of the stacked gate structure for solving the leakage problem and protecting the source/drain region 50 from pitting.

Figure 4B:
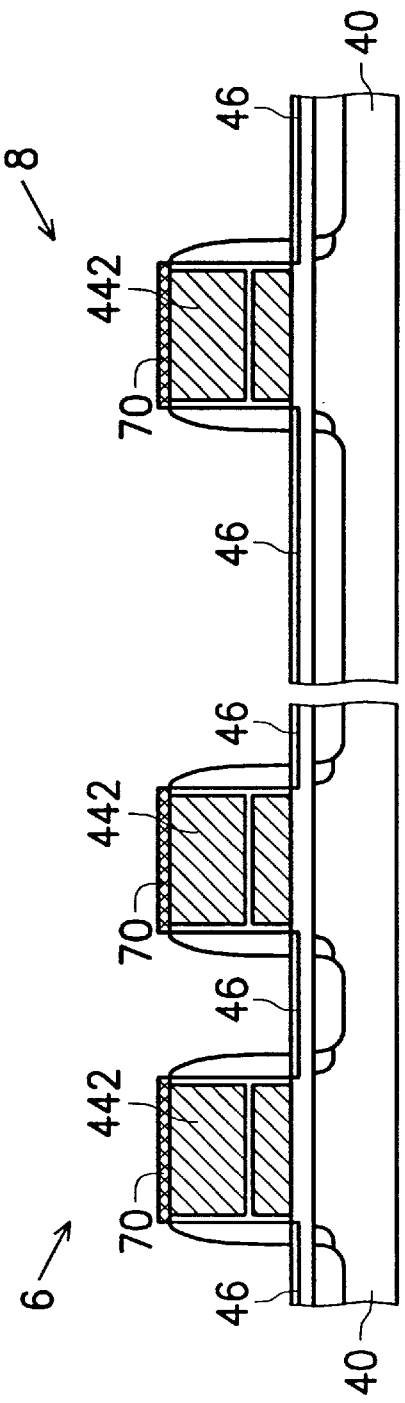
FIG. 4B is a cross-sectional diagram of the second modification of the present invention.

In the second modification, a cap layer formed on the top of the gate electrodes 44 is required prior to removing the gate electrodes 44. Referring again to FIG. 3D, before removing the gate electrodes 44, the oxide layer 46 is possibly removed and thus active regions are exposed in an etching environment. Thereby, as shown in FIG. 4B, a second dielectric layer 70 is formed on the top of the second gate electrode 442 to solve the problem.

In the third modification, a photoresist layer in the periphery area 8 is required after performing the etch-back process on the buffering layer 54 as shown in FIG. 3C. This avoids pitting of the source/drain regions 50 from insufficient etching on the oxide layer 46. Therefore, after etching the gate electrodes 44, the height of the gate electrode 44' in the periphery area 8 is higher than the height of the gate electrode 44 in the memory device area 6, as shown in FIG. 4C.

In the fourth modification, an ion-implantation process that is performed on the gate electrodes 44 and the source/drain regions 50 is performed in the memory device area 6 at the beginning and performed in the periphery area after etching the gate electrodes 44. Accordingly, after removing the predetermined height of the gate electrodes 44, 44' as shown in FIG. 4C, the ion-implantation process is again performed on the gate electrodes 44, 44' to form doped-polysilicon materials and on the semiconductor substrate 40 in the periphery area 8 to form a source/drain region surrounding the gate electrode 441 as shown in FIG. 4D.

Figure 4E:
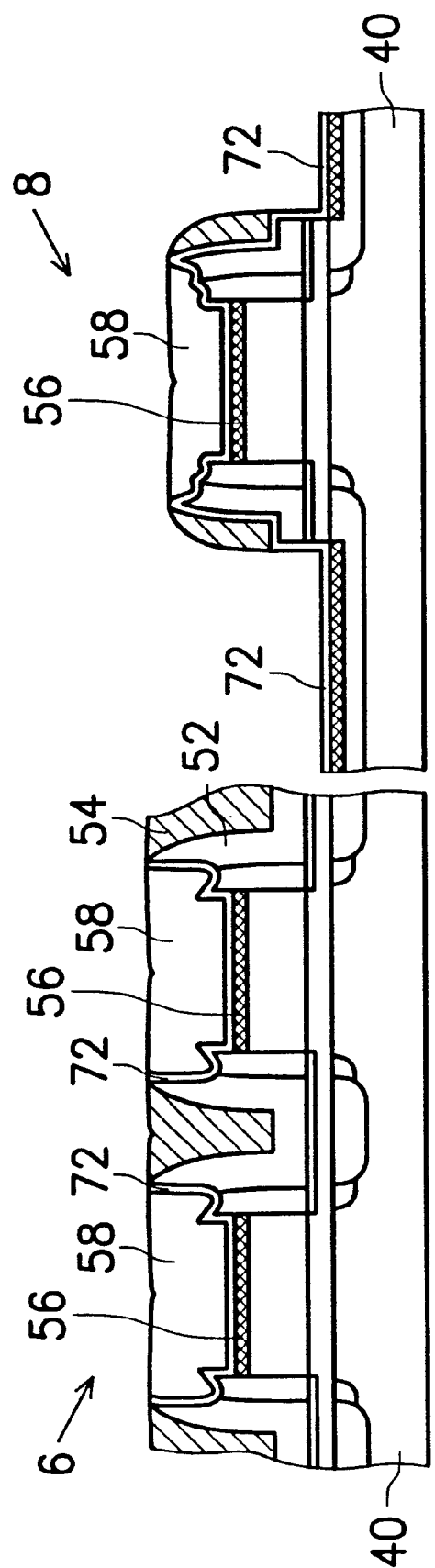
FIG. 4E is a cross-sectional diagram of the fifth modification of the present invention.

In the fifth modification, a cap layer is required prior to the formation of the gate cap layer 58 in order to prevent the silicide 56 from over-etching during the etch-back process on the gate cap layer 58. Consequently, compared with FIG. 3F, a third dielectric layer 72 is deposited on the silicide 56 and then the gate cap layer 58 is deposited on the third dielectric layer 72 as shown in FIG. 4E.

It is to be understood that the present invention is not limited to the embodiments described above, but encompasses any and all embodiments within the scope of the following claims.

What is claimed is:

1. A method of integrating salicide process and self-aligned contact process comprising steps of:

providing a semiconductor substrate defined as a memory device area and a periphery area wherein a plurality of doped gate electrodes and source/drain regions are formed in both the memory device area and the periphery area;

forming an oxide layer on the exposed surface of the semiconductor substrate to cover the gate electrodes and then forming a plurality of spacers on the sidewalls of the gate electrodes respectively;

forming a barrier layer and a buffering layer sequentially on the exposed surface of the semiconductor substrate to fill the gap between adjacent gate electrodes in the memory device area;

removing the buffering layer and the barrier layer from the top of the gate electrodes to expose the oxide layer positioned on the top of the gate electrodes in the memory device area and the periphery area and expose the oxide layer overlying the semiconductor substrate in the periphery area;

removing the exposed oxide layer and the underlying gate electrodes until the gate electrode reaches a predetermined height;

performing the salicide process to form a silicide on the exposed surface of the gate electrodes in the memory device area and the periphery area and on the source/drain regions in the periphery area;

forming a gate cap layer on the silicide which is covered on the gate electrodes;

forming an inter-layer dielectric on the exposed surface of the semiconductor substrate; and performing the self-aligned contact process to form a contact hole which exposes the source/drain region positioned between adjacent gate electrodes in the memory device area.

2. The method according to claim 1, wherein the gate electrode is a stacked gate structure composed of a first gate electrode, a dielectric layer and a second gate electrode.

3. The method according to claim 2, wherein the first gate electrode serves as a floating gate electrode.

4. The method according to claim 2, wherein the dielectric layer sandwiched between the first gate electrode and the second gate electrode is an ONO structure.

5. The method according to claim 1, wherein the spacer is selected from one of the following structures: a silicon oxide layer, a silicon oxide layer, and a combination of a silicon oxide layer and a silicon oxide layer.

6. The method according to claim 1, wherein the step of removing the buffering layer and the barrier layer from the top of the gate electrodes comprises:

performing an etch-back process on the buffering layer with the barrier layer as an etching stop layer; and removing the barrier layer from the top of the gate electrodes with the oxide layer as an etching stop layer.

7. The method according to claim 1, further comprising a step of forming a dielectric layer on the top of the gate electrodes prior to etching the exposed oxide layer and the underlying gate electrodes.

8. The method according to claim 1, wherein the step of removing the exposed oxide layer and the underlying gate electrodes comprises:

forming a photoresist layer to cover the exposed surface of the periphery area;

removing the exposed oxide layer and part of the underlying gate electrodes in the memory device area;

stripping the photoresist layer in the periphery area; and removing the gate electrodes in the memory device area till the predetermined height and removing the exposed oxide layer and the underlying gate electrodes in the periphery area, wherein the height of the gate electrode in the memory device area is lower than the height of the gate electrode in the periphery area.

9. The method according to claim 1, further comprising a step of forming a dielectric layer on the silicide prior to the formation of the gate cap layer.

10. The method according to claim 1, further comprising a step of filling the contact hole with a conductive layer to serve as a contact plug.

11. A method of integrating salicide process and self-aligned contact process comprising steps of:

providing a semiconductor substrate defined as a memory device area which has a plurality of doped gate electrodes and source/drain regions and a periphery area which has a gate electrode;

forming an oxide layer on the exposed surface of the semiconductor substrate to cover the gate electrodes and then forming a plurality of spacers on the sidewalls of the gate electrodes respectively;

forming a barrier layer and a buffering layer sequentially on the exposed surface of the semiconductor substrate to fill the gap between adjacent gate electrodes in the memory device area;

removing the buffering layer and the barrier layer from the top of the gate electrodes to expose the oxide layer positioned on the top of the gate electrodes in the memory device area and the periphery area and expose the oxide layer overlying the semiconductor substrate in the periphery area;

performing an ion implantation process on the gate electrodes in the memory device area and the periphery area, and effective regions in the periphery area to form a source/drain region surrounding the gate electrode in the periphery area;

removing the exposed oxide layer and the underlying gate electrodes until the gate electrode reaches a predetermined height;

performing the salicide process to form a silicide on the exposed surface of the gate electrodes in the memory device area and the periphery area and on the source/drain regions in the periphery area;

forming a gate cap layer on the silicide which is covered the gate electrodes;

forming an inter-layer dielectric on the exposed surface the semiconductor substrate; and performing the self-aligned contact process to form a contact hole which exposes the source/drain region positioned between adjacent gate electrodes in the memory device area.

12. The method according to claim 11, wherein the gate electrode is a stacked gate structure composed of a first gate electrode, a dielectric layer and a second gate electrode.

13. The method according to claim 12, wherein the first gate electrode serves as a floating gate electrode.

14. The method according to claim 12, wherein the dielectric layer sandwiched between the first gate electrode and the second gate electrode is an ONO structure.

15. The method according to claim 11, wherein the spacer is selected from one of the following structures: a silicon oxide layer, a silicon oxide layer, and a combination of a silicon oxide layer and a silicon oxide layer.

16. The method according to claim 11, wherein the step of removing the buffering layer and the barrier layer from the top of the gate electrodes comprises:

performing an etch-back process on the buffering layer with the barrier layer as an etching stop layer; and removing the barrier layer from the top of the gate electrodes with the oxide layer as an etching stop layer.

17. The method according to claim 11, further comprising a step of forming a dielectric layer on the top of the gate electrodes prior to etching the exposed oxide layer and the underlying gate electrodes.

18. The method according to claim 11, wherein the step of removing the exposed oxide layer and the underlying gate electrodes comprises:

forming a photoresist layer to cover the exposed surface of the periphery area;

removing the exposed oxide layer and part of the underlying gate electrodes in the memory device area;

stripping the photoresist layer in the periphery area; and removing the gate electrodes in the memory device area until a predetermined height is reached, and removing the exposed oxide layer and the underlying gate electrodes in the periphery area, wherein the height of the gate electrode in the memory device area is lower than the height of the gate electrode in the periphery area.

19. The method according to claim 11, further comprising a step of forming a dielectric layer on the silicide prior to the formation of the gate cap layer.

20. The method according to claim 11, further comprising a step of filling the contact hole with a conductive layer to serve as a contact plug.

* * * * *